US005506551A

United States Patent [19]

Kaneko et al.

[11] Patent Number: 5,506,551

[45] Date of Patent: Apr. 9, 1996

[54] RESONATOR AND CHIP TYPE FILTER USING THE RESONATOR

[75] Inventors: Toshimi Kaneko; Masahiko Kawaguchi; Katsuji Matsuta, all of Nagaokakyo, Japan

[73] Assignee: Murata Manufacturing Co., Ltd., Japan

[21] Appl. No.: 270,824

[22] Filed: Jul. 5, 1994

[30] Foreign Application Priority Data

Jul. 5, 1993 [JP] Japan .................................... 5-192000
Jul. 30, 1993 [JP] Japan .................................... 5-208793

[51] Int. Cl.[6] .................................................... H03H 7/00

[52] U.S. Cl. ........................... 333/185; 333/175; 333/184

[58] Field of Search .................................... 333/219, 222, 333/204, 184, 26, 246, 202, 175, 185; 336/200

[56] References Cited

U.S. PATENT DOCUMENTS 4,075,591 2/1978 Haas ........................................ 336/200
5,105,176 4/1992 Okamura et al. ........................ 333/219
5,351,020 9/1994 Okamura et al. ........................ 333/175
5,357,227 10/1994 Tonegawa et al. .................. 333/185
5,381,117 1/1995 Okamura et al. ........................ 333/175

FOREIGN PATENT DOCUMENTS 136107 8/1983 Japan .
6104 1/1994 Japan .

*Primary Examiner*—Benny Lee
*Assistant Examiner*—David H. Vu
*Attorney, Agent, or Firm*—Ostrolenk, Faber, Gerb & Soffen

[57] ABSTRACT

An earth electrode and a spiral pattern electrode are formed on both surfaces of a dielectric plate. One end of the pattern electrode is connected to the earth electrode. The width of the pattern electrode is made narrow in proportion to going from one end toward the other end. An area ratio S2/S1 is 0.15 or more when defining an area of the pattern electrode as S1, and an area of center portion where the pattern electrode is not formed as S2. A take-out electrode is drawn out from the pattern electrode with a distance from the one end of the pattern electrode. A chip type filter is manufactured by forming plural pattern electrodes on the dielectric plate, and coupling the pattern electrodes electromagnetically.

15 Claims, 21 Drawing Sheets

RESONATOR AND CHIP TYPE FILTER USING THE RESONATOR

FIELD OF THE INVENTION

The present invention relates to a resonator and a chip type filter using that resonator, and more particularly to a resonator of ¼ wavelength and a chip type filter having plural resonators which are connected electromagnetically with each other.

DESCRIPTION OF THE PRIOR ART

FIGS. 34–37 are illustrative views showing conventional resonators which are background of the present invention. The resonator shown in FIG. 34 is a dielectric coaxial resonator. The resonator includes a cylindrical dielectric body 1, and an electrode 2 is formed on the dielectric body 1 except one end. A resonator shown in FIG. 35 includes a dielectric plate 3, and an earth electrode (not shown) is formed on approximately all of one surface of the dielectric plate 3. A linear shaped pattern electrode 4 is formed on the other surface of the dielectric plate 3 opposite to the earth electrode. One end of the pattern electrode 4 is connected to the earth electrode via an end face of the dielectric plate 3. A micro strip line is formed with the dielectric plate 3, earth electrode and pattern electrode 4.

A resonator shown in FIG. 36 includes a bobbin 5, and a spiral groove is formed on outer face of the bobbin 5. A conductor 6 such as concentric cable is wound in the groove, and one end of the conductor is connected to a terminal. The bobbin 5 having conductor 6 is covered with a metal case. The resonator is the open-end type coaxial resonator of ¼ wavelength. A resonator shown in FIG. 37 includes a dielectric plate 3 in the same manner as the resonator shown in FIG. 35. An earth electrode (not shown) is formed on approximately all of one surface of the dielectric plate 3. A spiral pattern electrode 7 is formed on the other surface of the dielectric plate 3 opposite to the earth electrode. One end of the pattern electrode 7 is connected to the earth electrode via an end face of the dielectric plate 3. A take-out electrode 8 is drawn out from the pattern electrode 7 toward an end of the dielectric plate 3 with a distance from the grounded end of the pattern electrode 7.

The length L of the resonator shown in FIG. 34 or the length L of the pattern electrode of the resonator shown in FIG. 35 is indicated with the equation 1.

$$L = \frac{\lambda}{4\sqrt{\epsilon_{re}}} \qquad \text{Equation 1}$$

Where, $\lambda$; wavelength, $\epsilon_{re}$; effective dielectric constant of the dielectric body.

As understood from the equation 1, it is considered to use a dielectric material having high dielectric constant in order to miniaturize a resonator. However, the dielectric constant of the material can not be so high because of its temperature characteristics, and the limit of the dielectric constant $\epsilon_r$ is 100. Supposing the dielectric constant of 100 is replaced to the effective dielectric constant $\epsilon_{re}$, when the resonator of 1 GHz is manufactured, the length L=7.5 mm from the equation 1, which is very long. Therefore, it is difficult to miniaturize the resonator.

When the resonator is used, it is desirable to have an impedance match with an outer circuit. However, it occurs that the resonator can not have an impedance match with an outer circuit, because the characteristic impedance is determined by the dielectric constant or a size of the dielectric body or the size of each electrodes. Thus, it is necessary, in order to have an impedance match with an outer circuit, to connect an LC component for adjustment, or to trim the electrodes.

In the resonator shown in FIG. 36, inductance and capacitance per unit length are made large by winding the concentric cable and the like in a spiral shape, and the resonator is miniaturized by shortening the length of an axial direction. However, the gross area of the resonator becomes large because the concentric cable and the like is wound in a spiral shape, and it is difficult to miniaturize the resonator because capacitance generated in the coil is used. It is hard to manufacture the resonator because the conductor, bobbin and metal case are constructed individually, and cost reduction is difficult.

In the resonator shown in FIG. 37, magnetic flux is influenced between the adjacent pattern electrode parts because the pattern electrode is formed in a spiral shape, which opposes current flow. Therefore, effective resistance becomes large, and quality factor Q is deteriorated. In the resonator using the spiral pattern electrode, when the resonance frequency becomes low, it is necessary to narrow the pattern electrode and increase the number of windings, and the resistance becomes more large, thus Q is deteriorated.

Filters shown in FIGS. 38–40 are manufactured by using these resonators. In the filter shown in FIG. 38, an earth electrode is formed on approximately all of one surface of a dielectric plate 3, and two linear shaped pattern electrodes 4 are formed on the other surface of the dielectric plate 3. One end of each of pattern electrodes 4 is connected to the earth electrode via an end face of the dielectric plate 3. Micro strip line resonators are formed with the dielectric plate 3, earth electrode and pattern electrodes 4. A take-out terminal 9 which functions as an input/output terminal is drawn out from each of the pattern electrodes 4 toward an end of the dielectric plate 3 with a distance from the grounded end of the respective pattern electrodes 4. A filter is formed by connecting the micro strip line resonators electromagnetically.

The filter shown in FIG. 39 includes two bobbins 5, and resonators are formed by winding conductors 6 to the bobbins 5. One end of each of conductors 6 is connected to a terminal. Two bobbins 5 having conductors 6 are covered with a metal case. The case has a window for coupling between two resonators, and two resonators are coupled electromagnetically via the coupling window. The filter shown in FIG. 40 includes two dielectric plates 3. An earth electrode and opposed spiral pattern electrode 7 are formed on both surfaces of each dielectric plate 3, and a resonator is formed. The plural resonators are coupled electromagnetically via coupling control patterns 9. The filter is manufactured by forming patterns on sheets made of dielectric material, and laminating the sheets and co-firing the laminate.

These filters have problems similar to the above resonators. In the filter shown in FIG. 38, it is difficult to miniaturize the filter. In the filter shown in FIG. 39, it is difficult to miniaturize the filter, and hard to manufacture, and cost reduction of the filter is difficult.

In the filter shown in FIG. 40, current flow is opposed by magnetic flux between adjacent pattern electrode parts, and thus Q is deteriorated. When resonance frequency becomes low, it is necessary to narrow the pattern electrodes and increase the number of windings, and the resistance becomes more large, thus Q is deteriorated. Since the sheets made of dielectric material are laminated and co-fired, cracks are generated due to the contraction of the dielectric material at the time of firing. The variation of size is large, and a trimming process and the like is necessary for obtaining high accuracy, thus cost reduction of the filter is difficult and the filter is expensive.

SUMMARY OF THE INVENTION

It is, therefore, a primary object of the present invention to provide a miniaturized resonator having high Q and high accuracy.

And, it is the object of the present invention to provide a miniaturized chip type filter having high Q and high accuracy.

The present invention is directed to a resonator comprising a dielectric plate; an earth electrode formed on one surface of the dielectric plate in a plane shape; a pattern electrode formed in a spiral shape on the other surface of the dielectric plate opposite to the earth electrode and one end of the pattern electrode being connected to the earth electrode; and a take-out electrode drawn out from the pattern electrode toward an end of the dielectric plate with a distance from the one end of the pattern electrode; wherein width of the pattern electrode is made narrow in proportion to going from the one end toward the other end.

The present invention is directed to a resonator comprising a dielectric plate; an earth electrode formed on one surface of the dielectric plate in a plane shape; a pattern electrode formed in a spiral shape on the other surface of the dielectric plate opposite to the earth electrode and one end of the pattern electrode being connected to the earth electrode; and a take-out electrode drawn out from the pattern electrode toward an end of the dielectric plate with a distance from the one end of the pattern electrode; wherein area ratio S2/S1 is 0.15 or more when defining an area of the pattern electrode as S1 and an area of a center portion of the spiral pattern electrode where the pattern electrode is not formed as S2. In the resonator, it is desirable that a width of the pattern electrode is made narrow in proportion to going from one end toward the other end.

The present invention is directed to a chip type filter comprising a dielectric plate; an earth electrode formed on one surface of the dielectric plate in a plane shape; plural pattern electrodes each formed in a spiral shape on the other surface of the dielectric plate opposite to the earth electrode and one end of each of pattern electrodes being connected to the earth electrode; and take-out electrodes each drawn out from each of the pattern electrodes toward an end of the dielectric plate with a distance from the one end of each of the pattern electrodes; wherein area ratio S2/S1 is 0.15 or more when defining an area of each of the pattern electrodes as S1 and an area of a center portion of each of the spiral pattern electrodes where the pattern electrode is not formed as S2, and the pattern electrodes are coupled electromagnetically. In the chip type filter, it is desirable that a width of each of the pattern electrodes is made narrow in proportion to going from one end toward the other end.

In the resonator having earth electrode and spiral pattern electrode, a current distribution in the pattern electrode is large at a connecting portion with the earth electrode, and becomes small in proportion to going toward the other end. Therefore, the resistance corresponding to the current distribution can be obtained in case that a width of pattern electrode is made wide at a portion where the current distribution is large and a width of pattern electrode is made narrow at a portion where the current distribution is small.

In the resonator having earth electrode and spiral pattern electrode, it is found that the resonator having high Q can be obtained in case that the ratio S2/S1 is 0.15 or more when defining an area of the pattern electrode as S1 and an area of center portion where the pattern electrode is not formed as S2. In the resonator too, the resistance corresponding to the current distribution can be obtained in case that a width of pattern electrode is made wide at a connecting portion with the earth electrode and a width of pattern electrode is made narrow in proportion to going toward the other end.

According to the present invention, the resistance corresponding to the current distribution can be obtained by changing the width of the pattern electrode, and thus Q of the resonator can be high. In the resonator having spiral pattern electrode, it is found that the resonator having high Q can be obtained in case that the area ratio is S2/S1 0.15 or more. In this resonator, the resistance corresponding to the current distribution can be obtained by changing the width of the pattern electrode, thus the resonator having high Q can be obtained to add to the effect of the area ratio S2/S1. Furthermore, since the resonator has a spiral pattern electrode, the resonator can be miniaturized as compared with the resonator having linear shaped pattern electrode.

In the resonator having spiral pattern electrode, impedance can be adjusted by changing a portion of take-out electrode. Therefore, desirable impedance can be obtained, and thus it is not necessary to use the other LC components in order to have an impedance matching with outer circuit. Since each electrode can be formed in a precise size by using a method of etching and the like, the resonator having high accuracy can be obtained. Since plural electrode patterns can be formed on one dielectric plate precisely, massproduction of the resonator is possible, and cost down of the resonator is possible.

Similarly to the resonator, in the filter having coupled resonators consisted of earth electrode and spiral pattern electrodes, it is found that the filter having high Q can be obtained in case that the ratio S2/S1 is 0.15 or more when defining an area of each of the pattern electrodes as S1 and an area of portion where each of the pattern electrodes is not formed as S2. The current distribution of the pattern electrode is large at a connecting portion with an earth electrode, and becomes small in proportion to going to the other end. Therefore, the resistance corresponding to the current distribution can be obtained in case that a width of pattern electrode is made wide at a connecting portion with the earth electrode and a width of pattern electrode is made narrow in proportion to going toward the other end. Thus the filter having high Q can be obtained by changing the width of the pattern electrodes to add to the effect of the area ratio S2/S1.

Since the filter has spiral pattern electrodes, the filter can be miniaturized as compared with a filter having linear pattern electrodes. Since the filter has spiral pattern electrodes, the length of the parallel portions of the adjacent two pattern electrodes are short as compared with the filter having linear pattern electrodes. Thus, the electromagnetic coupling between resonators is small, and thus the distance between two resonators can be short. Therefore, the filter can further be miniaturized.

In the filter having spiral pattern electrodes, input/output impedance can be adjusted by changing a portion of take-out electrodes. Since each electrode can be formed in a precise size by using a method of etching and the like, the filter having high accuracy can be obtained. Since plural electrode patterns can be formed on one dielectric plate precisely, massproduction of the filter is possible, and cost down of the filter is possible.

The above and other object, features, aspects and advantages of the present invention will become more apparent from the following detailed description of the embodiment made with reference to the drawings.

DESCRIPTION OF THE PREFERRED EMBODIMENTS

Figure 1:
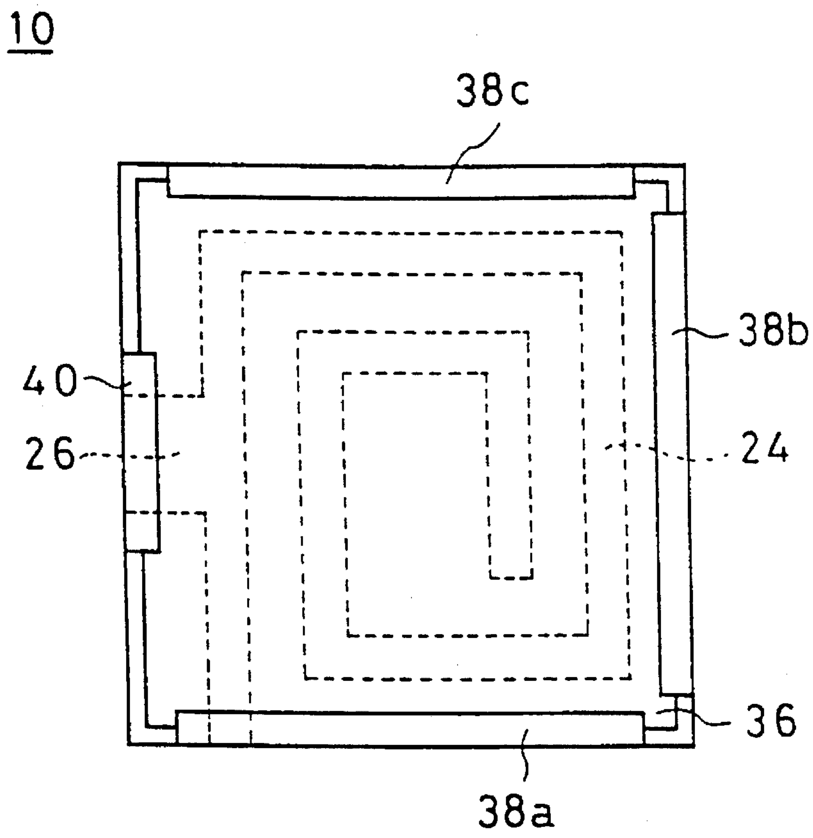
FIG. 1 is a plan view showing one embodiment of the present invention.
Figure 2:
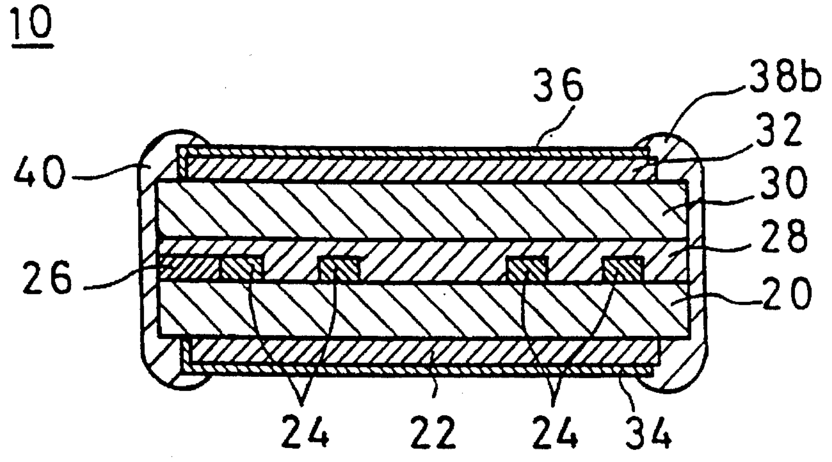
FIG. 2 is a sectional view showing a resonator of FIG. 1.
Figure 3:
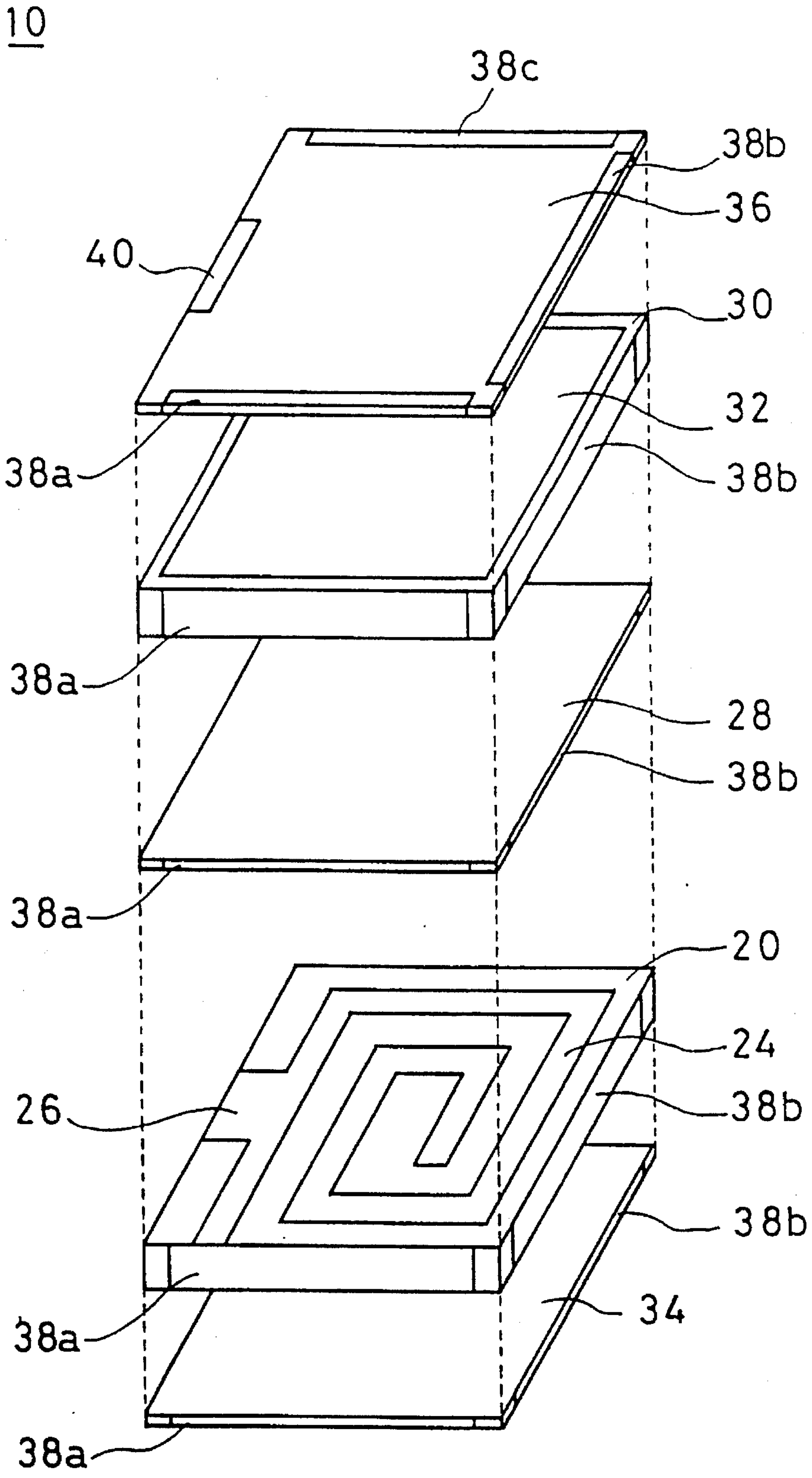
FIG. 3 is an exploded perspective view showing a resonator of FIG. 1.
Figure 4:
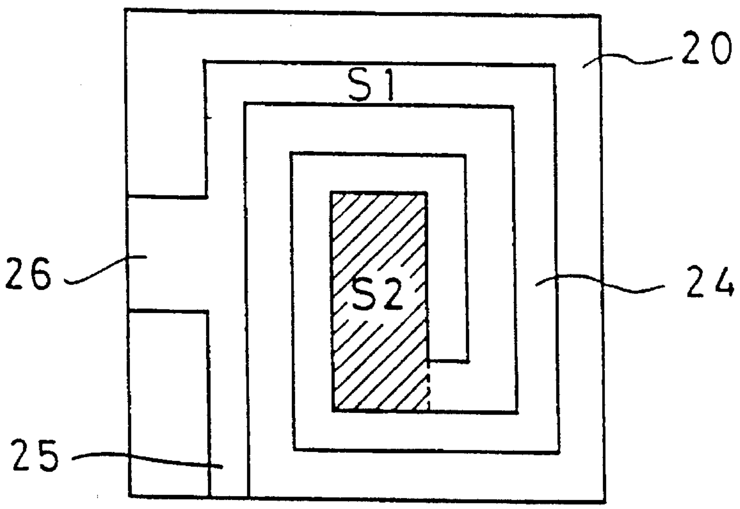
FIG. 4 is a plan view showing a first dielectric plate of resonator of FIG. 1.
Figure 5:
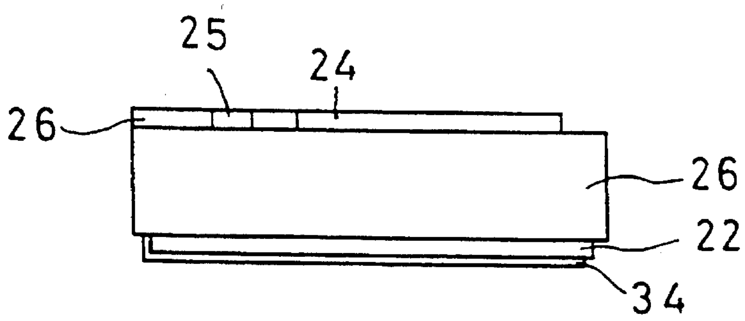
FIG. 5 is a side view showing a first dielectric plate of FIG. 4.
Figure 6:
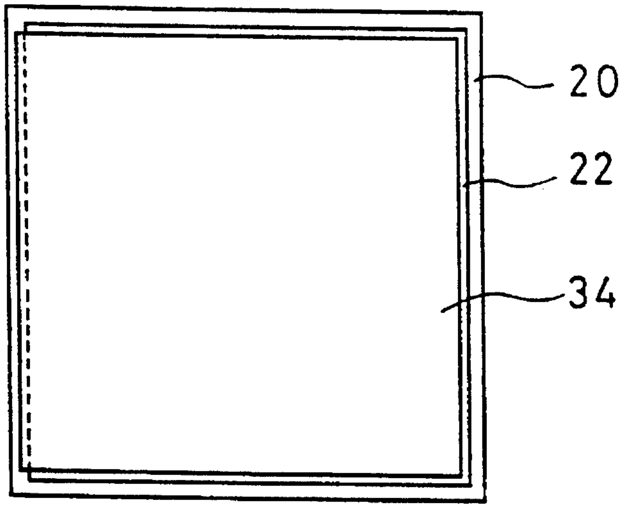
FIG. 6 is a bottom view showing a first dielectric plate of FIG. 4.

FIG. 1 is a plan view showing one embodiment of the present invention, and FIG. 2 is its sectional view, and FIG. 3 is its exploded perspective view. A resonator 10 includes a first dielectric plate 20 having a plane shape. As the first dielectric plate 20, the dielectric plate having a dielectric constant of 70 or more is used. The first dielectric plate 20 is shown in FIGS. 4, 5 and 6, and an earth electrode 22 is formed on approximately all of one surface of the dielectric plate 20. A pattern electrode 24 is formed on the other surface of the first dielectric plate 20 opposite to the earth electrode 22. The pattern electrode 24 is formed in a spiral shape from one end of the first dielectric plate 20 toward a center portion with a constant width. An area ratio S2/S1 is made 0.15 or more when defining an area of the pattern electrode as S1, and an area of the center portion where the pattern electrode is not formed as S2.

Figure 7:
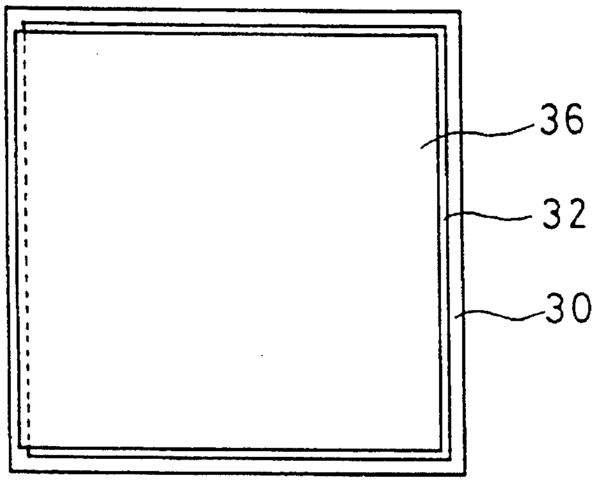
FIG. 7 is a plan view showing a second dielectric plate of resonator of FIG. 1.
Figure 8:
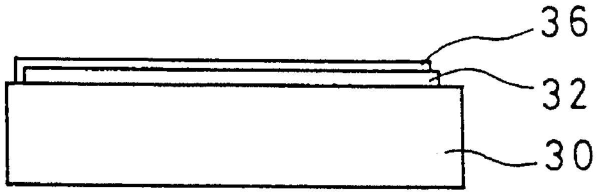
FIG. 8 is a side view showing a second dielectric plate of FIG. 7.
Figure 9:
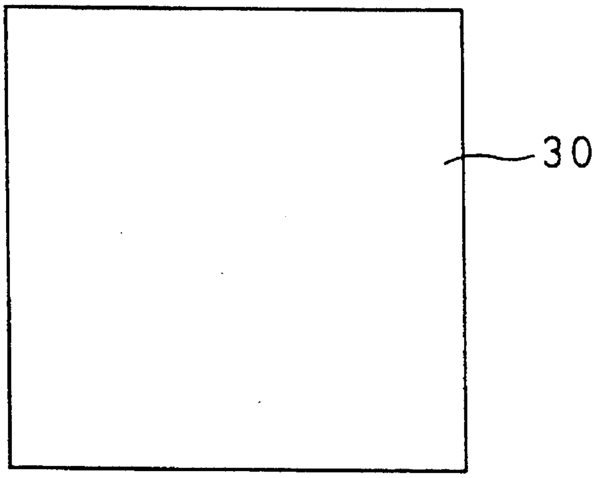
FIG. 9 is a bottom view showing a second dielectric plate of FIG. 7.

A take-out electrode 26 is drawn out from the pattern electrode 24 toward an end of the first dielectric plate 20. The take-out electrode 26 is formed with a distance from one end 25 of the pattern electrode 24 which is drawn out to the end of the first dielectric plate 20. An adhesive layer 28 such as a polyimide layer is formed on the pattern electrode 24 and the take-out electrode 26. A second dielectric plate 30 is formed on the adhesive layer 28. As the second dielectric plate 30, a dielectric plate having, for example, a dielectric constant less than the first dielectric plate 20 is used. The second dielectric plate 30 is shown in FIGS. 7, 8 and 9, and a shield electrode 32 is formed on approximately all of surface of the second dielectric plate 30. Protective layers 34 and 36 are formed so that the earth electrode 22 and the shield electrode 32 are covered. The protective layers 34 and 36 are formed so that one end portion of each of the earth electrode 22 and the shield electrode 32 is exposed except the direction that the take-out electrode 26 is drawn out.

Three terminal electrodes 38*a*, 38*b* and 38*c* are formed at side faces of the resonator 10. The terminal electrodes 38*a*, 38*b* and 38*c* are formed at side faces where the take-out electrode 26 is not drawn out. The pattern electrode 24, the earth electrode 22 and the shield electrode 32 are connected with the terminal electrode 38*a*. The other terminal electrodes 38*b* and 38*c* are connected to the earth electrode 22 and the shield electrode 32. A take-out terminal electrode 40 is formed the side face of the resonator 10 where the take-out electrode 26 is drawn out. The take-out terminal electrode 40 is connected to the take-out electrode 26. The impedance of the resonator 10 is determined by the distance between the take-out electrode 26 and the end 25 of the pattern electrode 24 which is connected to the terminal electrode 38*a*. Since one end of the pattern electrode 24 is connected to the earth electrode 22 and the shield electrode 32, the resonator 10 is a strip line resonator of ¼ wavelength. Therefore, the length of the pattern electrode 24 is $\lambda/4$ when defining a wavelength as $\lambda$. In the resonator 10, when defining a wavelength as $\lambda$, an effective dielectric constant as $\epsilon_{re}$ and a rectifying value as k, the length L of the pattern electrode 24 is indicated with the equation 2.

$$L = \frac{k\lambda}{4\sqrt{\epsilon_{re}}} \qquad \text{Equation 2}$$

The effective dielectric constant $\epsilon_{re}$ is indicated with the equations 3 and 4.

$$\epsilon_{re} - \frac{\epsilon_r + 1}{2} + \frac{\epsilon_r - 1}{2}\left\{\left(1 + 12\frac{t}{W}\right)^{-1/2} + \frac{1}{25}\left(1 - \frac{W}{t}\right)^2\right\} \qquad \text{Equation 3}$$

(when $W/t \leqq 1$)

$$\epsilon_{re} = \frac{\epsilon_r + 1}{2} + \frac{\epsilon_r = 1}{2}\left(1 + 12\frac{t}{W}\right)^{-1/2} \qquad \text{Equation 4}$$

(when $W/t > 1$)

Figure 10:
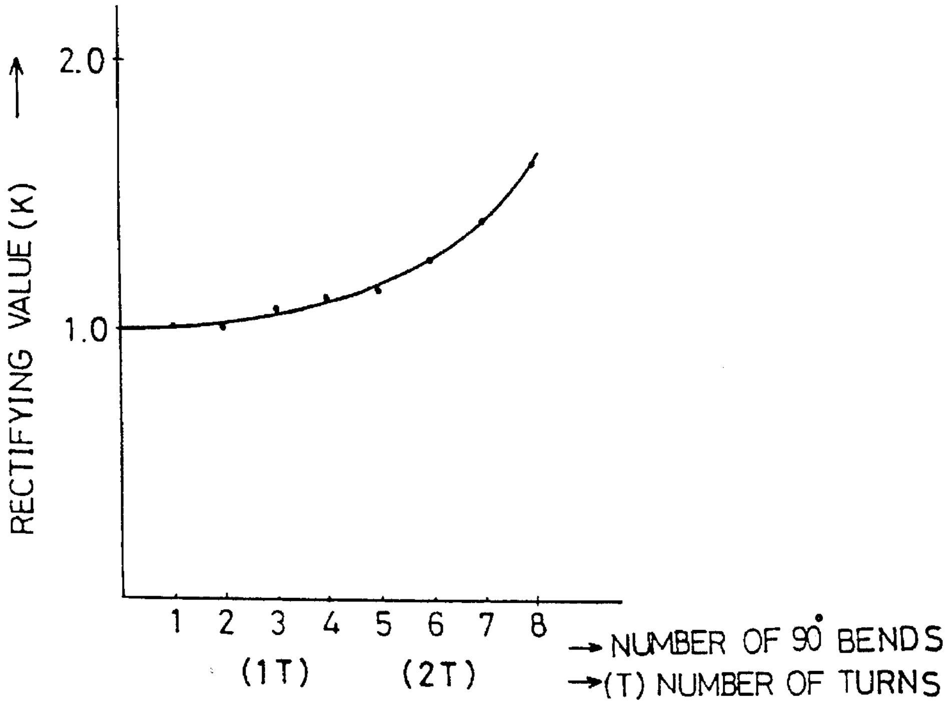
FIG. 10 is a graph showing a relation between number of bending of pattern electrode and rectifying value.

Where, $\epsilon_r$; dielectric constant of the first dielectric plate 20, W; width of the pattern electrode 24, t; thickness of the first dielectric plate 20, and rectifying value k is the value corresponding to the number of bends of the pattern electrode 24 and to the dielectric constant and the thickness of the second dielectric plate 30 . When the dielectric constant and the thickness of the dielectric plates are constant, the rectifying value k is obtained from the graph shown in FIG. 10 which shows the relation between the rectifying value and the number of 90° bends of the pattern electrode 24.

The first dielectric plate 20 is prepared for manufacturing the resonator 10. The earth electrode 22, the pattern electrode 24 and the take-out electrode 26 are formed on the surfaces of the first dielectric plate 20 by the thin film method, etching method or another method. The shield electrode 32 is formed on the surface of the second dielectric plate 30 by the thin film method. The protective layers 34 and 36 are formed on the earth electrode 22 of the first dielectric plate 20 and on the shield electrode 32 of the second dielectric plate 30 with a glass or resin. A thermal plastic polyimide resin is printed or painted on the first dielectric plate 20 on which the pattern electrode 24 is formed, and the first dielectric plate 20 is adhered to the second dielectric plate 30 and heat-pressed. Thereafter, the terminal electrodes 38*a*, 38*b*, 38*c* and the take-out terminal electrode 40 are formed, and thus the resonator 10 is manufactured.

Figure 11:
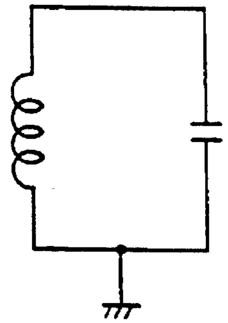
FIG. 11 is an equivalent circuit diagram of resonator of FIG. 1.

Though no capacitance pattern is formed, the resonator 10 has a equivalent circuit shown in FIG. 11. The reason is that the resonator has a strip line structure, and capacitance is formed between the pattern electrode 24 and the earth electrode 22. Though capacitance is formed between the pattern electrode 24 and the shield electrode 32, capacitance is formed mainly between the pattern electrode 24 and the earth electrode 22 which are on opposite surfaces of the first dielectric plate 20 having high dielectric constant. The capacitance can be changed by changing the thickness of the first dielectric plate 20, and thus the resonance frequency can be changed. The capacitance can be changed by changing the dielectric constant of the first dielectric plate 20 or the width of the pattern electrode 24. According to tests, the resonance frequency of the resonator 10 can be adjusted between 1 GHz to 5 GHz by changing the dielectric constant or width of the first dielectric plate 20 or the area of the pattern electrode 24.

Figure 12:
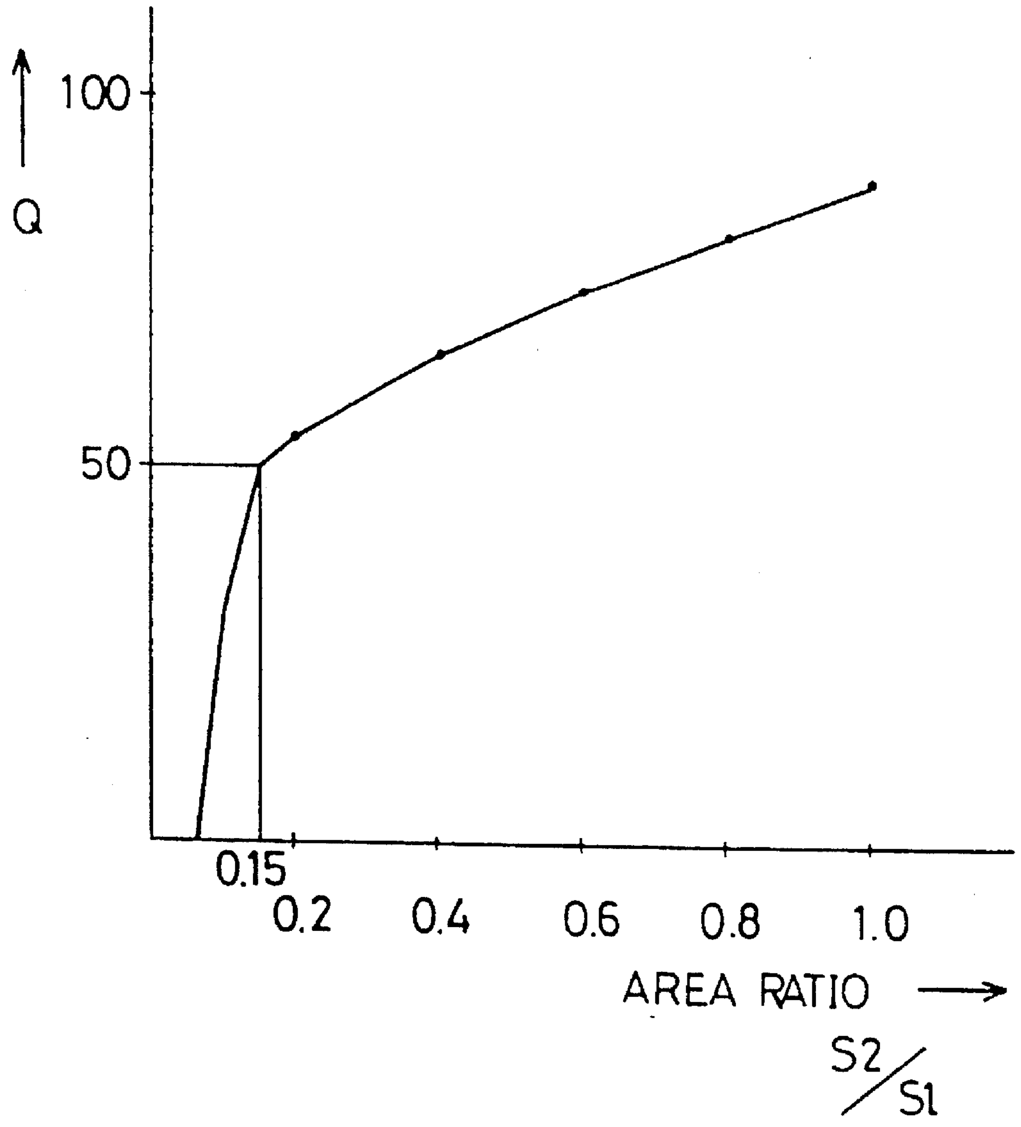
FIG. 12 is a graph showing a relation between Q of resonator and area ratio S2/S1 when defining an area of pattern electrode of resonator as S1 and an area where pattern electrode is not formed as S2.

In the resonator 10, the quality factor Q can be increased by providing that the area ratio S2/S1 is 0.15 or more. For example, the relation between the area ratio S2/S1 and Q is measured with a resonance frequency of 1 GHz, and the result is shown in FIG. 12. Since the resonator 10 requires a Q of 50 or more practically, the area ratio S2/S1 of 0.15 or more is decided to be suitable. It is found from the graph that the Q of the resonator is deteriorated suddenly when the area ratio S2/S1 is less than 0.15. Though the graph corresponds to the resonator of 1 GHz, the resonator having a higher resonance frequency has similar characteristics. In the resonator 10, the impedance can be adjusted by changing the distance between the take-out electrode 26 and the end 25 of the pattern electrode 24. Thus, the resonator 10 can have an impedance match with the outer circuit.

Figure 13:
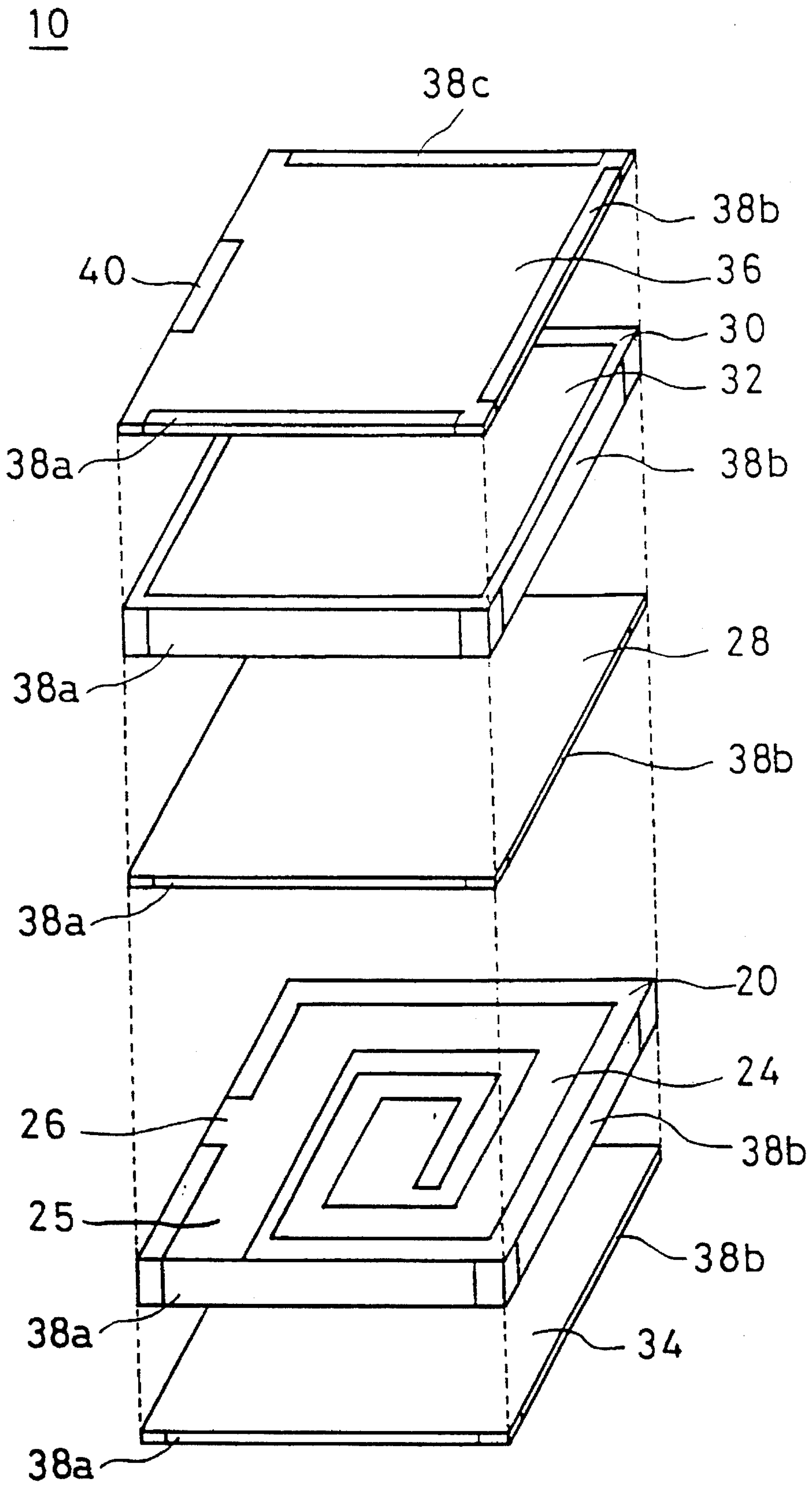
FIG. 13 is an exploded perspective view showing another embodiment of the present invention.

As shown in FIG. 13, the pattern electrode 24 may be formed so that the width becomes narrower as it goes to the inner end from the end 25 connected to the terminal electrode 38*a*. The earth electrode 22, the pattern electrode 24 and the take-out electrode 26 are formed with high accuracy by the thin film method or etching method.

The strip line resonator has high current distribution at the end 25 connected to the terminal electrode 38*a*, and has low current distribution at the other end. Therefore, effective resistance can be reduced by widening the pattern electrode at the portion where the current distribution is high. Thus, Q of the resonator 10 can be high as compared with the resonator having a pattern electrode of constant width.

Figure 14:
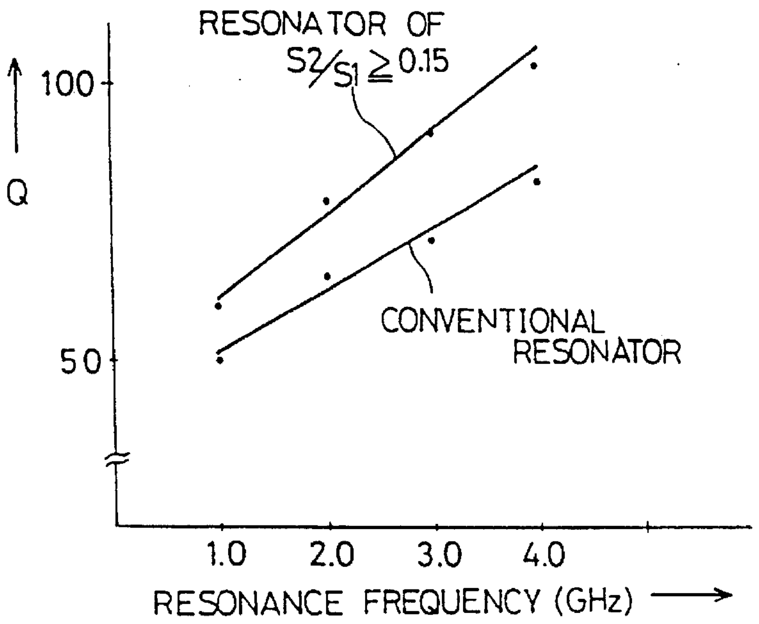
FIG. 14 is a graph showing a relation between resonance frequency and Q of the filters whose area ratio are 0.15 or more and less than 0.15 in the filters having spiral pattern electrodes whose width are constant.
Figure 15:
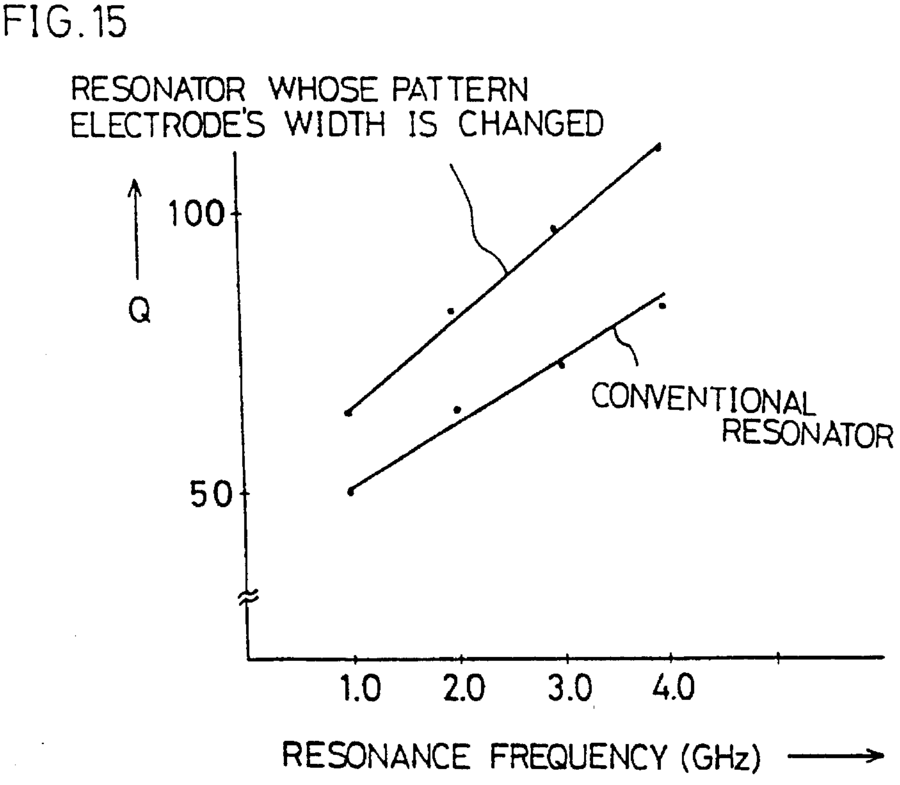
FIG. 15 is a graph showing a relation between resonance frequency and Q of the filters which widths of pattern electrodes are changed and constant in the filters having area ratio S2/S1 of less than 0.15.

Tests were made on resonators having spiral pattern electrodes as follows: the resonator having an area ratio S2/S1 of less than 0.15 and changing width of the pattern electrode, the resonator having an area ratio S2/S1 of 0.15 or more and constant width of the pattern electrode, and the resonator having an area ratio S2/S1 of less than 0.15 and constant width of the pattern electrode. For that purpose, the resonator 10 has a plane size of 1.6 mm and 1.6 mm, a width of the first dielectric plate 20 and the second dielectric plate 30 of 600 μm, a dielectric constant of the first dielectric plate 20 $\epsilon_r$=100, a dielectric constant of the second dielectric plate 30 $\epsilon_r$=21.5, and all lengths of the pattern electrode 24 of 6.2 mm. In one resonator, the pattern electrode 24 is divided according to the ratio of 1:2:2:1 from its one end, and widths of the respective portions are formed according to the ratio of 1.25:1.0:0.75:0.5. Further, the resonator having a area ratio of 0.15 and a constant width of the pattern electrode is manufactured. In this resonator, for increasing the area S2 where the pattern electrode is not formed, a distance between the adjacent portions of the pattern electrode is less than 100 μm. As a conventional resonator, the resonator having an area ratio of less than 0.15 and constant width of the pattern electrode is manufactured. In these resonators, Q of the resonators is measured with a resonance frequency of 2 GHz, and the result is shown in FIG. 14 and 15. As understood from these figures, Q of the resonator having a changing width of the pattern electrode is about 80, and Q of the resonator having an area ratio of 0.15 and constant width of the pattern electrode is about 70, and Q of the conventional resonator is about 65.

In the resonator 10 having spiral pattern electrode, when the width of the pattern electrode 24 is made narrower in away from the end which is connected to the terminal electrode 38*a*, and an area ratio S2/S1 is 0.15 or more, Q of the resonator can be increased still more. In such resonator 10, the effect of an area ratio S2/S1 of 0.15 or more and the effect of changing width of the pattern electrode 24 are combined, the resonator having further high Q is obtained.

Figure 16:
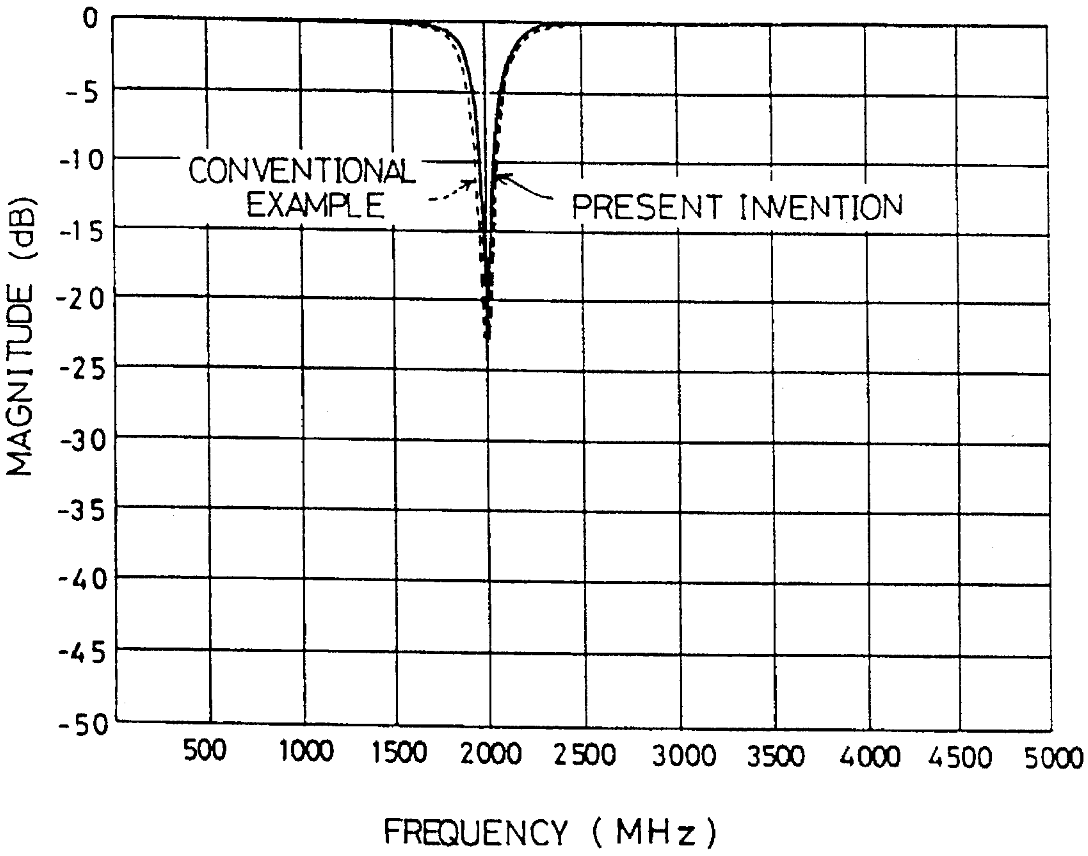
FIG. 16 is a graph showing frequency characteristics of the filter having pattern electrode whose area ratio S2/S1 is 0.15 or more and width is changed and conventional filter.

As a test, as shown in FIG. 13, the resonator of 2 GHz having a pattern electrode whose width is changed and S2/S1 of 0.15 or more is manufactured, and the frequency characteristics is measured, and the result is shown in FIG. 16. As a conventional example , the frequency response of the resonator having an area ratio S2/S1 of less than 0.15 and constant width of the pattern electrode is measured, and the result is shown with dotted lines. In the resonator having an area ratio S2/S1 of 0.15 or more and changing width of the pattern electrode, as shown in FIG. 16, the peak of the resonance frequency is at 2 GHz, and the response curve is stepper as compared with the conventional resonator. And, the other frequency range has a flat characteristics. When Q of these resonators are measured, the resonator of the present invention has Q of about 97, and the conventional resonator has Q of about 65.

The resonator of the present invention uses the material having a dielectric constant of 70 or more as the material of first dielectric plate 20, because the overall length L of the pattern electrode 24 become long when the dielectric constant is low. When all length of the pattern electrode becomes long, the number of windings of the pattern electrode 24 increases. Thus, an area S2 of the portion where the pattern electrode is not formed can not be secured, and Q of the resonator is deteriorated. When the area S2 is secured, the resonator becomes large. The first dielectric plate 20 necessitates the material having dielectric constant of 70 or more for securing sufficient Q, and for obtaining a miniaturized resonator.

Impedance of the resonator can be adjusted by changing the position of the take-out electrode drawn out from the pattern electrode, and thus the resonator has impedance matching with the outer circuit. Therefore, other LC components are not necessary to have impedance matching. The resonator having high accuracy can be obtained because each electrode can be formed in a precise size by the method of etching or another method, and thus the resonator having high accuracy can be obtained. For example, the size accuracy of the electrode is ±10–20 μm when the electrode is formed by the method of thick film plating method. Moreover, the size accuracy of the electrode can be ±2–3 μm when the electrode is formed by the thin film method or etching method. Variation of resonance frequency of the resonator can be less than 1.0% by having high size accuracy. Since plural electrode patterns can be formed on one dielectric plate precisely, massproduction of the resonator is possible, and cost reduction of the resonator is possible.

Figure 17:
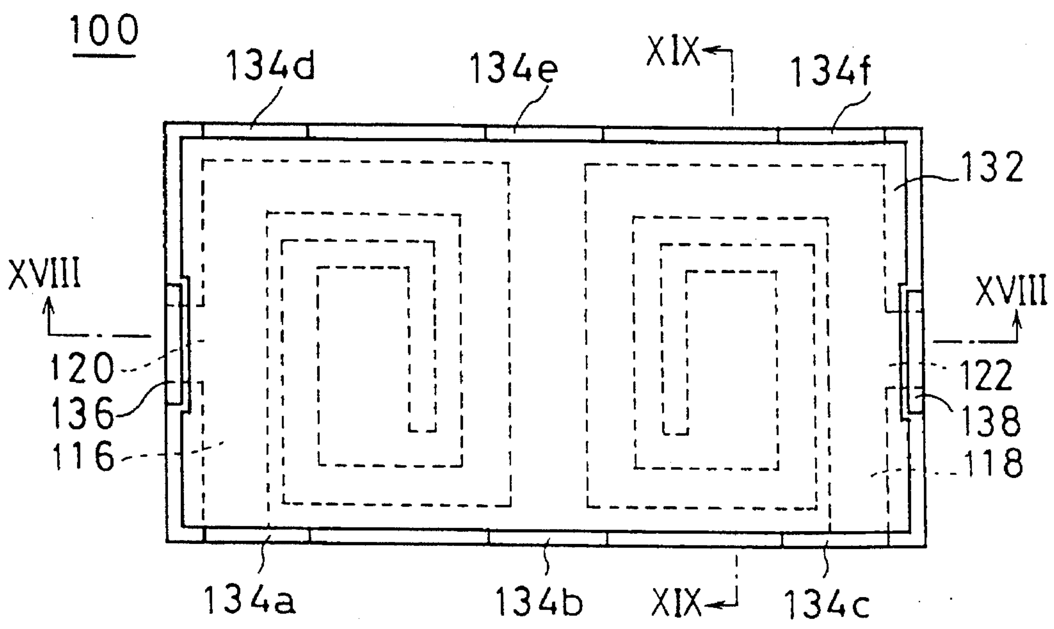
FIG. 17 is a plan view showing one embodiment of a chip type filter of the present invention.
Figure 18:
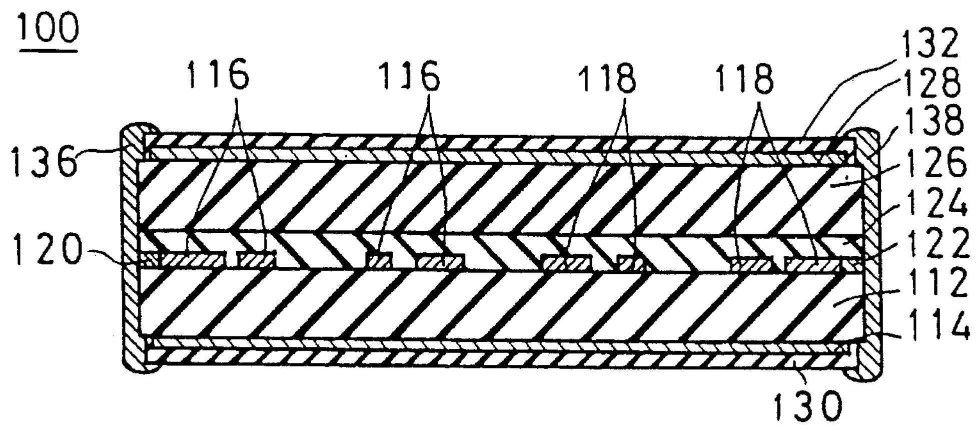
FIG. 18 is a sectional view showing taken along line XVIII—XVIII of a chip type filter shown in FIG. 17.
Figure 19:
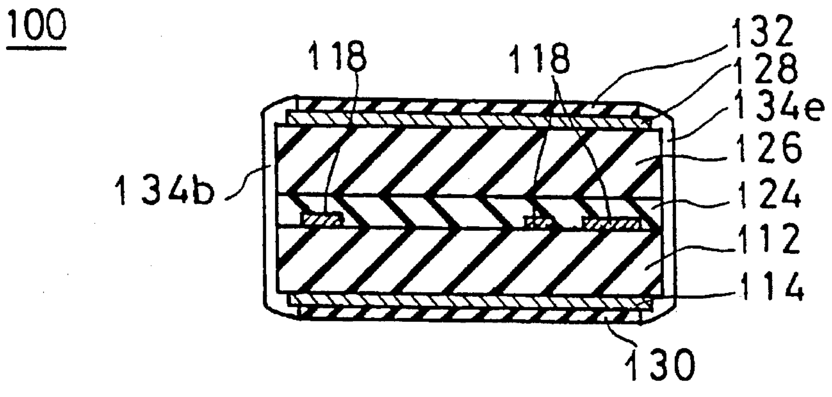
FIG. 19 is a sectional view showing taken along line XIX—XIX of a chip type filter shown in FIG. 17.
Figure 20:
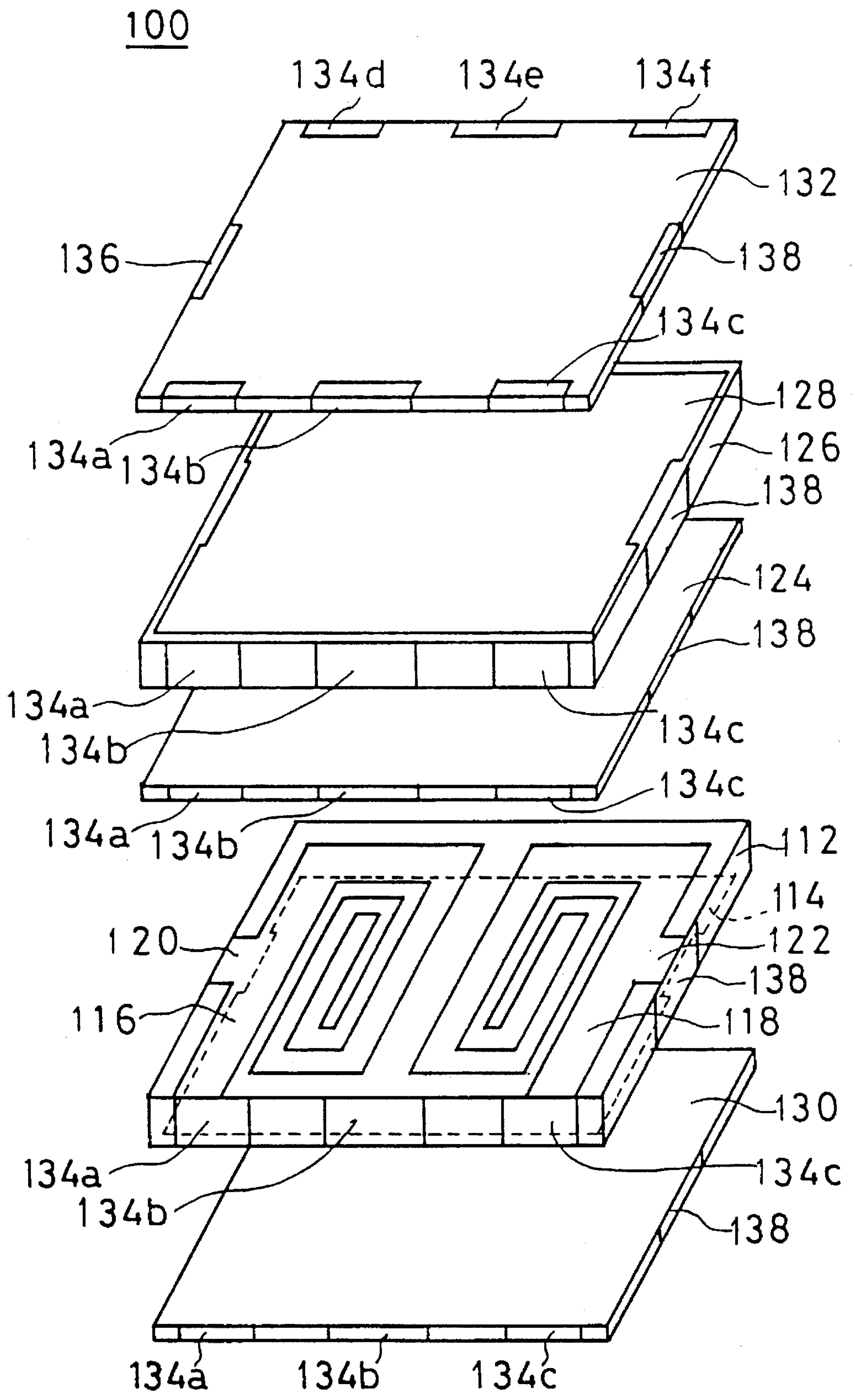
FIG. 20 is an exploded perspective view showing a chip type filter of FIG. 17.
Figure 21:
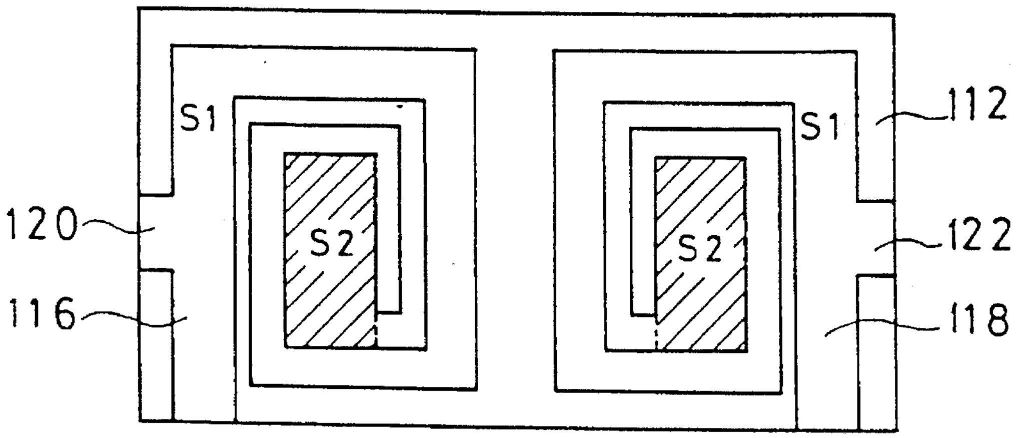
FIG. 21 is a plan view showing a first dielectric plate of a chip type filter of FIG. 17.
Figure 22:
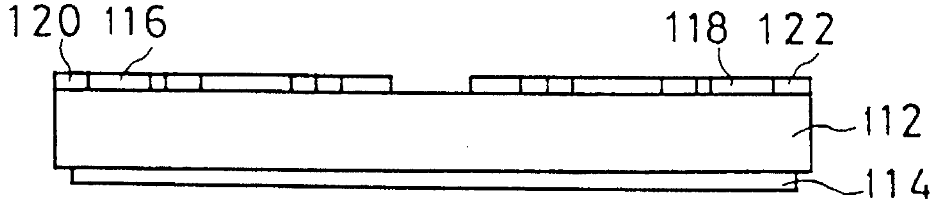
FIG. 22 is a side view showing a first dielectric plate of FIG. 21.
Figure 23:
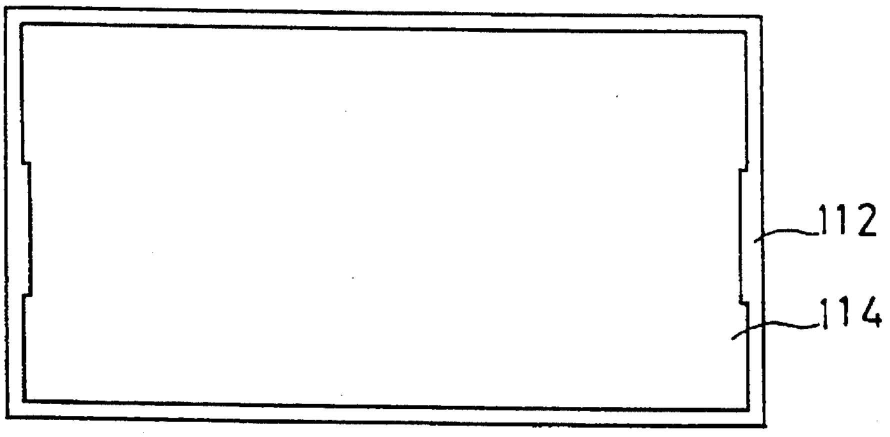
FIG. 23 is a bottom view showing a first dielectric plate of FIG. 21.

FIG. 17 is a plan view showing a chip type filter of the present invention, FIG. 18 and FIG. 19 are sectional views taken along the line XVIII—XVIII and line XIX—XIX, and FIG. 20 is its exploded perspective view. The chip type filter 100 includes a first dielectric plate 112 having a rectangular shape. As shown in FIGS. 21, 22 and 23, an earth electrode 114 is formed on approximately all of one surface of the first dielectric plate 112. Two pattern electrodes 116 and 118 are formed on the other surface of the first dielectric plate 112 opposite to the earth electrode 114.

The pattern electrode 116 is formed in a spiral shape from one end of the first dielectric plate 112 toward inside portion at one side portion of the first dielectric plate 112. The other pattern electrode 118 is formed in a spiral shape from the same end with the first dielectric plate 112 toward inside portion at the other side portion of the first dielectric plate 112. An area ratio S2/S1 of each of the pattern electrodes 116 and 118 is 0.15 or more when defining an area of each of pattern electrodes 116 and 118 as S1, and an area of center portion where each of pattern electrodes 116 and 118 is not formed as S2. Each of the pattern electrodes 116 and 118 is formed so that the width becomes narrow in proportion to going from end of the first dielectric plate 112 toward inside portion.

Figure 24:
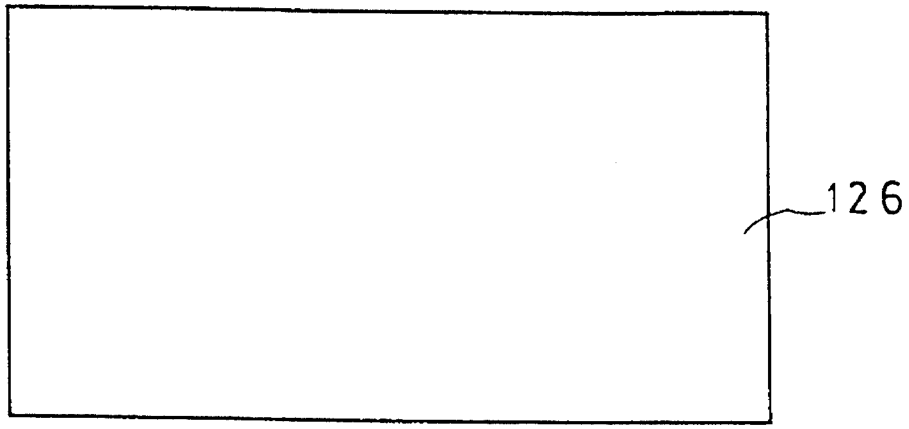
FIG. 24 is a plan view showing a second dielectric plate of a chip type filter of FIG. 17.
Figure 25:
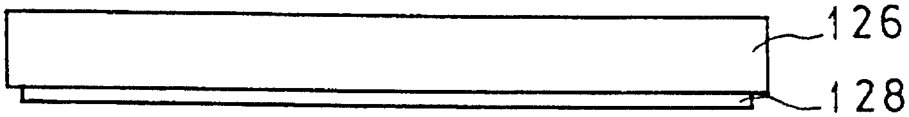
FIG. 25 is a side view showing a second dielectric plate of FIG. 24.
Figure 26:
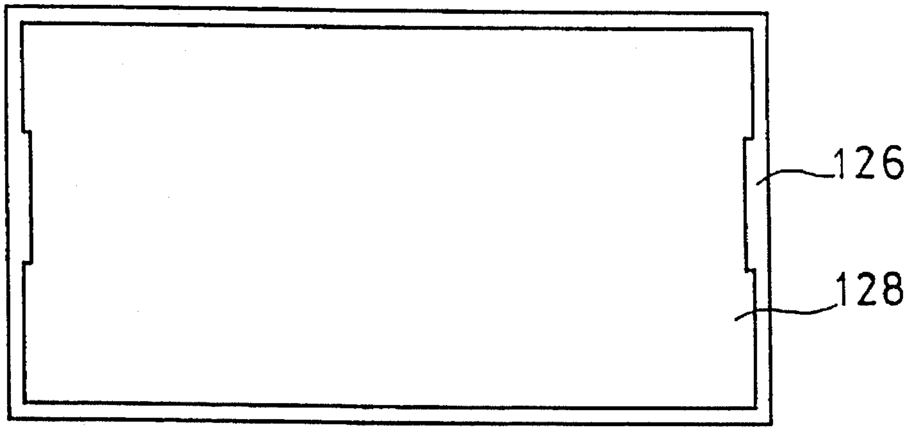
FIG. 26 is a bottom view showing a second dielectric plate of FIG. 24.

A take-out electrode 120 is drawn out from the pattern electrode 116 toward an end of the first dielectric plate 112. The take-out electrode 120 is formed with a distance from one end of the pattern electrode 116 which is drawn out to the end of the first dielectric plate 112. Similarly, a take-out electrode 122 is drawn out from the pattern electrode 118 toward an end of the first dielectric plate 112. The take-out electrode 122 is formed with a distance from one end of the pattern electrode 118 which is drawn out to the end of the first dielectric plate 112. An adhesive layer 124 such as polyimide layer is formed on the pattern electrodes 116, 118 and the take-out electrodes 120, 122. A second dielectric plate 126 is formed on the adhesive layer 124. As a material of the second dielectric plate 126, the material having low dielectric constant than the first dielectric plate is used. As shown in FIGS. 24, 25 and 26, a shield electrode 128 is formed on approximately all of one surface of the second dielectric plate 126. Protective layers 130 and 132 are formed so that the earth electrode 114 and the shield electrode 128 are covered. The protective layers 130 and 132 are formed so that ends of the earth electrode 114 and the shield electrode 128 are exposed except the directions where the take-out electrodes 120 and 122 are drawn out.

Six terminal electrodes 134*a*, 134*b*, 134*c*, 134*d*, 134*e* and 134*f* are formed at opposite side faces of the chip type filter 100. The terminal electrodes 134*a*–134*f* are formed at side faces where the take-out electrodes 120 and 122 are not drawn out. The pattern electrode 116, the earth electrode 114 and the shield electrode 128 are connected by the terminal electrode 134*a*. Similarly, the pattern electrode 118, the earth electrode 114 and the shield electrode 128 are connected by the terminal electrode 134*c*. The other terminal electrodes 134*b*, 134*d*, 134*e* and 134*f* are connected to the earth electrode 114 and the shield electrode 128. A take-out terminal electrode 136 is formed at a side face where the take-out electrode 120 is drawn out, and a take-out terminal electrode 138 is formed at a side face where the take-out electrode 122 is drawn out. The take-out terminal electrode 136 is connected to the take-out electrode 120, and the take-out terminal electrode 138 is connected to the take-out electrode 122. The input/output impedance is determined by the distance between the take-out electrode 120 and one end of the pattern electrode 116 which is connected to the terminal electrode 134*a*, and the distance between the take-out electrode 122 and one end of the pattern electrode 118 which is connected to the terminal electrode 134*c*.

The chip type filter 100 has a strip line structure, and two resonators are formed with two pattern electrodes 116 and 118. The filter is formed by coupling the adjacent portions of the pattern electrodes 116 and 118 electromagnetically.

Figure 27:
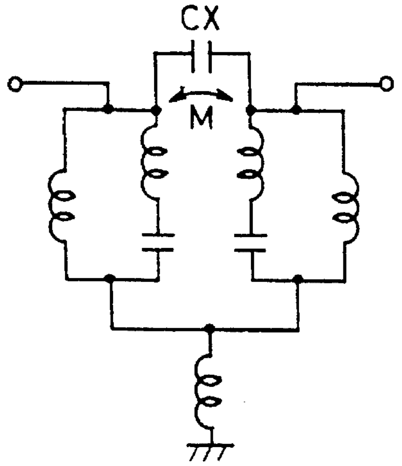
FIG. 27 is an equivalent circuit diagram of a chip type filter of FIG. 17.

Though the chip type filter 100 has no capacitor pattern, the chip type filter 100 has an equivalent circuit as shown in FIG. 27. The reason is that the chip type filter 100 has a strip line structure, and capacitance is formed between the pattern electrodes 116, 118 and the earth electrode 114. Though capacitance is formed between the pattern electrodes 116, 118 and the shield electrode 128, capacitance is formed mainly between the pattern electrodes 116, 118 and the earth electrode 114 which have the first dielectric plate 112 having high dielectric constant. The capacitance can be changed by changing the thickness of the first dielectric plate 112, and thus the resonance frequency can be changed. The capacitance can be changed by changing the dielectric constant of the first dielectric plate 112 or the width of the pattern electrodes 116, 118. In the equivalent circuit shown in FIG. 27, CX and M indicate the electromagnetical coupling.

Figure 28:
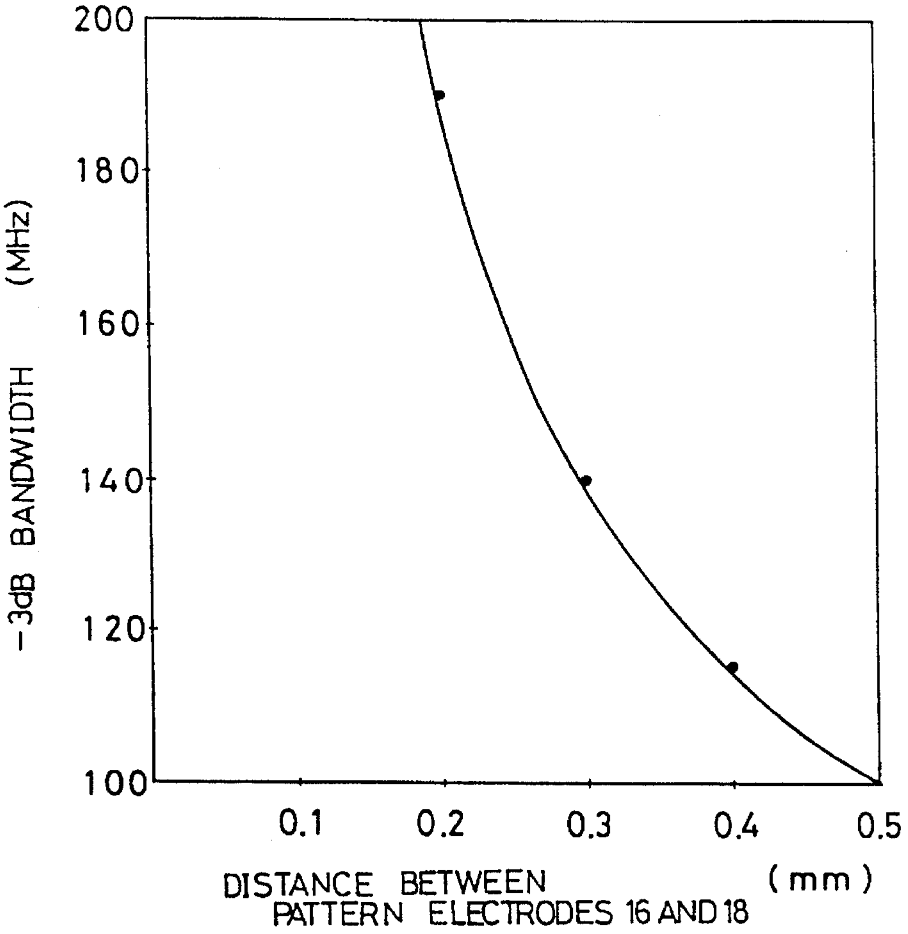
FIG. 28 is a graph showing a relation between a distance between pattern electrodes and −3dB bandwidth of a chip type filter of FIG. 17.

The frequency bandwidth of the chip type filter 100 can be adjusted by changing the distance between two pattern electrodes 116 and 118. In the chip type filter 100, –3 dB bandwidth is measured by changing the distance between the pattern electrodes 116 and 118, and the result is shown in FIG. 28. As shown in FIG. 28, the bandwidth becomes wide when the distance between the pattern electrodes is short, and the bandwidth becomes narrow when the distance between the pattern electrodes is long. When the distance between the pattern electrodes becomes more narrow than it needs, it is not desirable because the filter has double-top characteristics.

In the chip type filter 100, the quality factor Q can be increased in case that the area ratio S2/S1 is 0.15 or more. In the chip type filter 100, the input/output impedance can be adjusted by changing the distance between the take-out electrode 120 and one end of the pattern electrode 116 and the distance between the take-out electrode 122 and one end of the pattern electrode 118. Thus, the chip type filter 100 can have an impedance matching with the outer circuit easily.

In the chip type filter 100, each of the pattern electrodes 116 and 118 is formed so that the width becomes narrow in proportion to going to the other end from one end which is connected to the terminal electrodes 134*a* and 134*c*. Q of the chip type filter 100 can further be increased by such structure. The reason is that the strip line has high current distribution at one end where is connected to the earth electrode, and has low current distribution at the other end, and thus the resistance corresponding to the current distribution can be obtained by changing the width of the pattern electrode. In such chip type filter 100, the effect of an area ratio S2/S1 of 0.15 or more and the effect of changing width of the pattern electrodes 116, 118 are combined, the chip type filter having further high Q is obtained.

Figure 29:
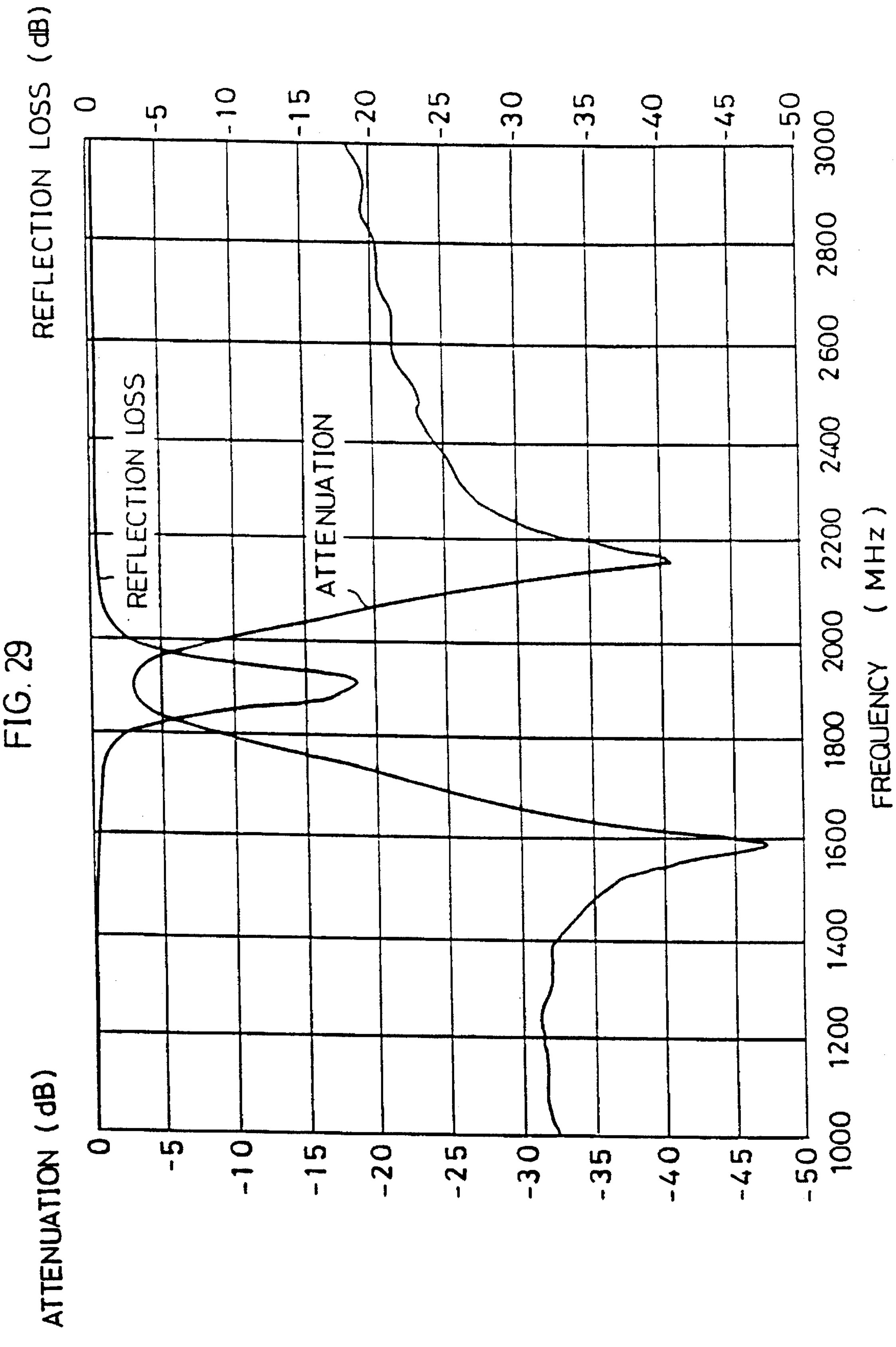
FIG. 29 is a graph showing a frequency characteristics of a chip type filter of FIG. 17.

The frequency characteristics of the chip type filter 100 is shown in FIG. 29. As shown in FIG. 29, the chip type filter 100 has characteristics of low insertion loss and sharp shape. Needless to say, when an area ratio S2/S1 is 0.15 or more, the chip type filter having large Q can be obtained even if the widths of the pattern electrodes 116 and 118 are constant.

Since the chip type filter 100 has spiral pattern electrodes 116 and 118, the chip type filter 100 can be miniaturized as compared with the filter having linear pattern electrodes. In the chip type filter of the present invention, the length of the parallel portions of the adjacent pattern electrodes are short as compared with the filter having linear pattern electrodes. Therefore, electromagnetic coupling between two resonators is weak, and the distance between two pattern electrodes can be short. Thus, the chip type filter can be miniaturized still more. As the chip type filter having the characteristics shown in FIG. 29, the band-pass filter having the plane size of 3.2 mm and 1.6 mm.

In the chip type filter of the present invention, similar to the resonator, it is desirable to use the material having dielectric constant of 70 or more as the material of the first dielectric plate in order to secure the sufficient Q and obtain the miniaturized filter.

The input/output impedance of the chip type filter can be adjusted by changing the position of the take-out electrodes drawn out from the pattern electrodes. Furthermore, the chip type filter having high accuracy can be obtained because each electrodes can be formed in a precise size by the method of etching or the like. When the chip type filter is manufactured by such method, the variation of the center frequency of passband can be less than ±1.0%. Since plural electrode patterns can be formed on one dielectric plate precisely, massproduction of the chip type filter is possible, and cost down of the chip type filter is possible.

Figure 30:
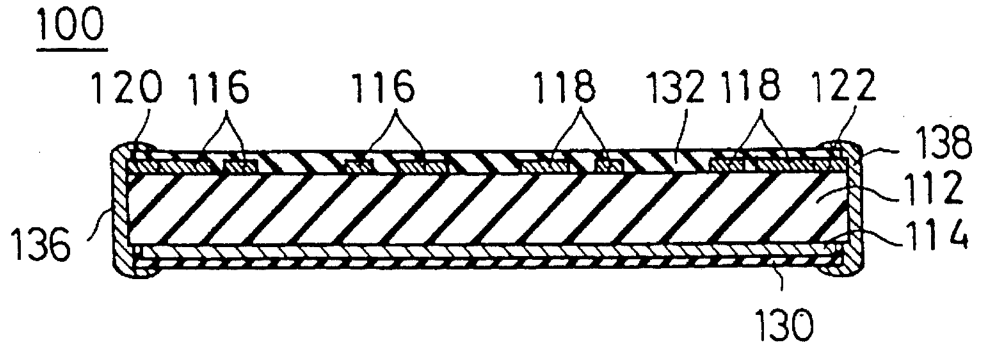
FIG. 30 is a sectional view showing an another embodiment of a chip type filter of the present invention.
Figure 31:
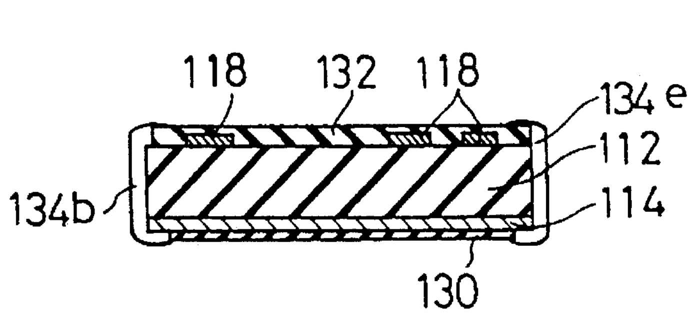
FIG. 31 is a sectional view showing the other portion of a chip type filter of FIG. 30.

As shown in FIGS. 30 and 31, the chip type filter 100 may not have a shield electrode. In the chip type filter 100, the protective layer 132 is formed on the pattern electrodes 116, 118 and the take-out electrodes 120, 122. In the chip type filter 100, magnetic flux for coupling between two resonators is not prevented because the shield electrode is not formed. Therefore, magnetic coupling between resonators is not-prevented, and enough coupling can be obtained. The enough magnetic coupling can be obtained between the pattern electrodes 116 and 118, and the chip type filter having good characteristics can be obtained.

Figure 32:
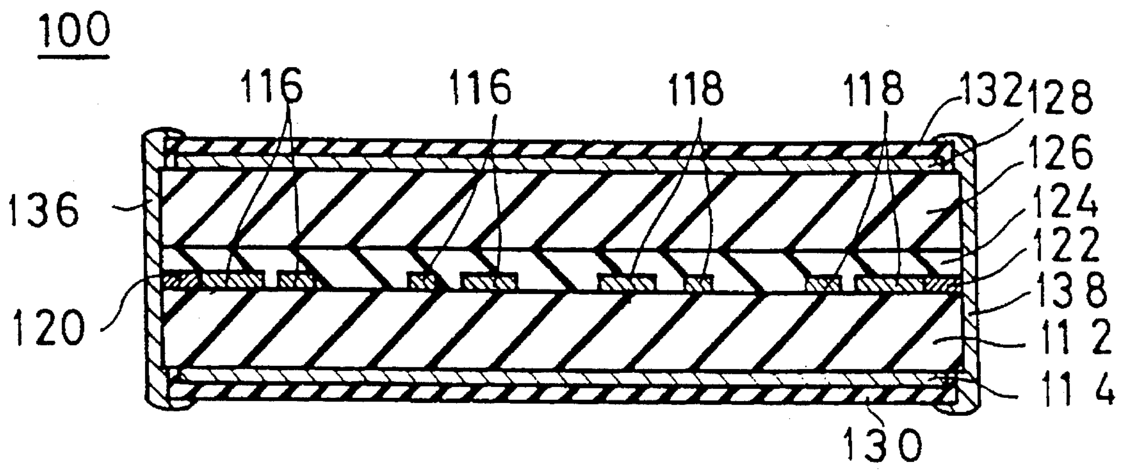
FIG. 32 is a sectional view showing a still another embodiment of a chip type filter of the present invention.
Figure 33:
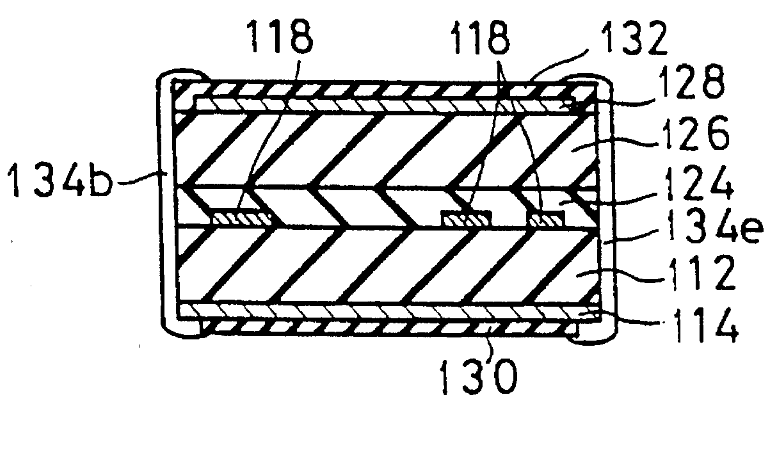
FIG. 33 is a sectional view showing the other portion of a chip type filter of FIG. 32.
Figure 34:
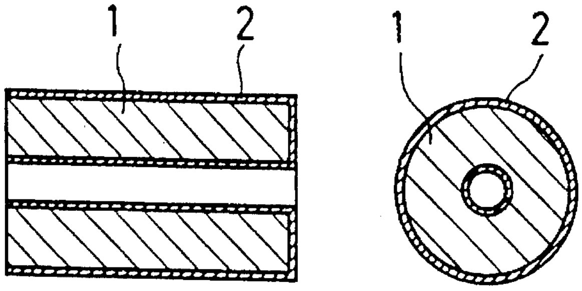
FIG. 34 PRIOR ART
FIG. 34 is an illustrative view showing a conventional resonator which is a back ground of the present invention.
Figure 35:
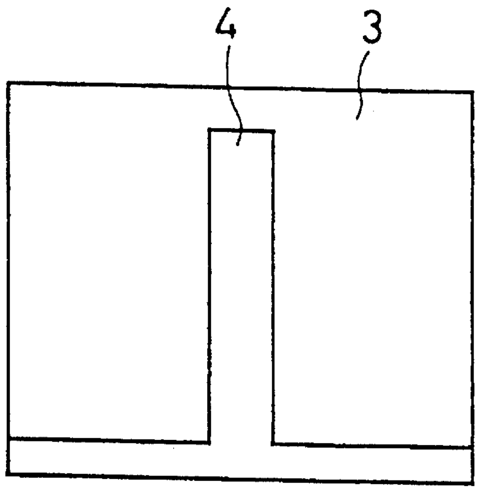
FIG. 35 PRIOR ART
FIG. 35 is a plan view showing an another example of a conventional resonator.
Figure 36:
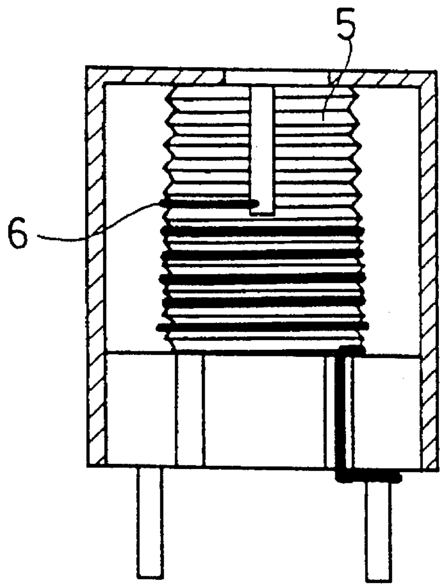
FIG. 36 PRIOR ART
FIG. 36 is an illustrative view showing a still another example of a conventional resonator.
Figure 37:
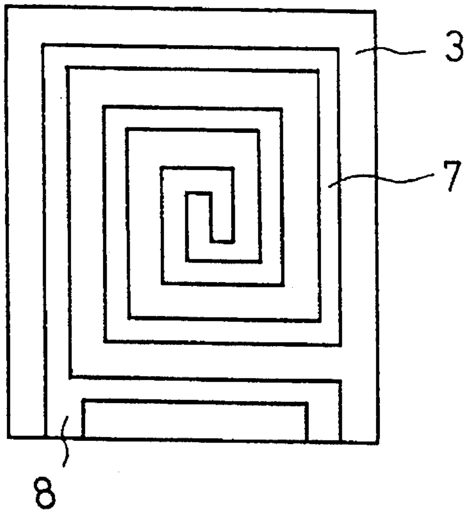
FIG. 37 PRIOR ART
FIG. 37 is a plan view showing the other example of a conventional resonator.
Figure 38:
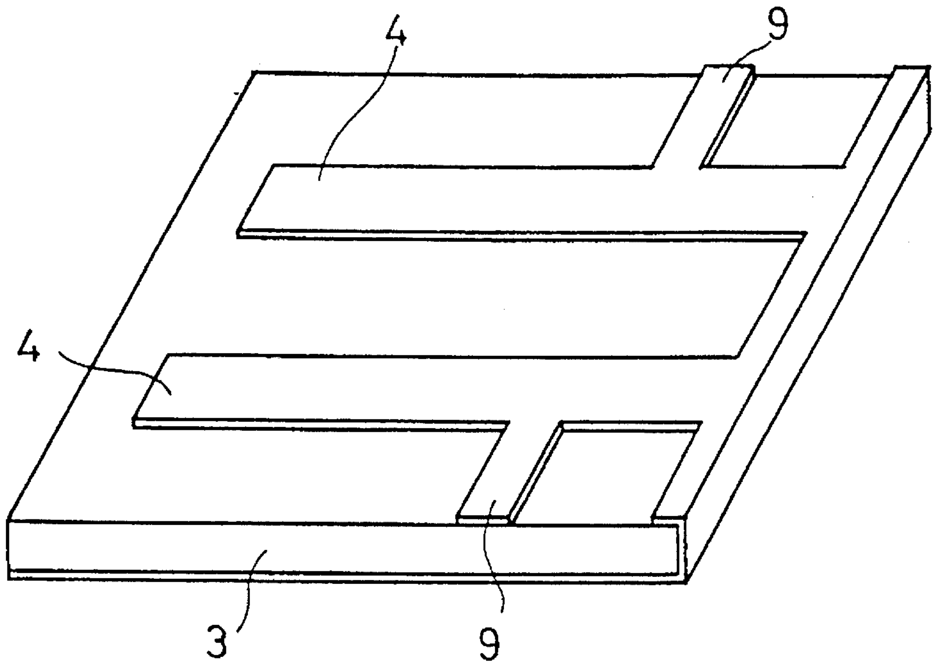
FIG. 38 PRIOR ART
FIG. 38 is an illustrative view showing a conventional filter which is background of the present invention.
Figure 39:
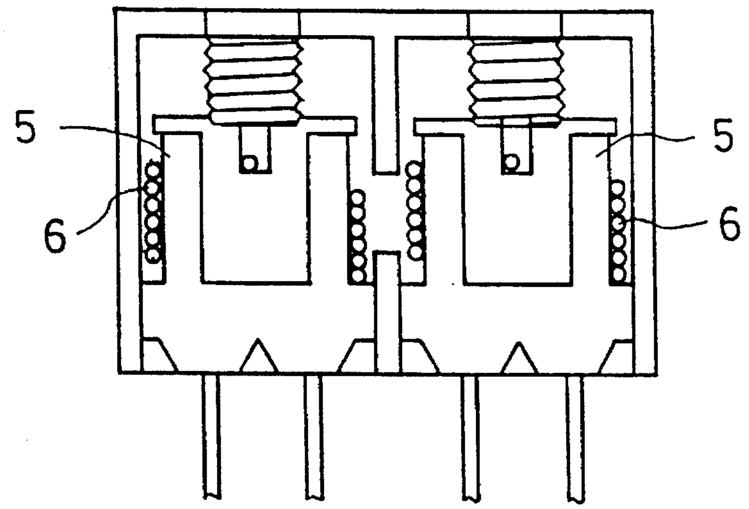
FIG. 39 PRIOR ART
FIG. 39 is an illustrative view showing an another example of a conventional filter.
Figure 40:
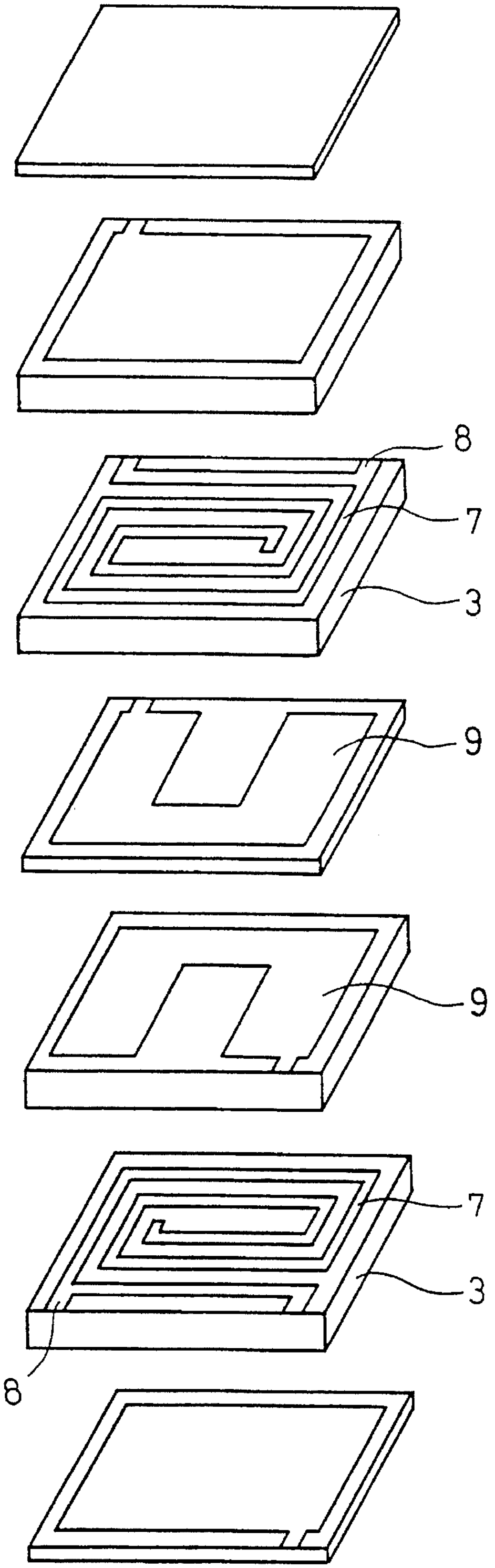
FIG. 40 PRIOR ART
FIG. 40 is an exploded perspective view showing a still another example of a conventional filter.

As shown in FIGS. 32 and 33, the shield electrode 128 on the pattern electrodes 116 and 118 may be an insulation state from the other electrodes. In the chip type filter 100, capacitance between the pattern electrodes 116, 118 and the shield electrode 128 is not earthed, and enough electrical coupling can be obtained. Therefore, enough electrical coupling between the pattern electrodes 116 and 118 can be obtained, and the chip type filter having a good characteristics can be obtained.

While the present invention has been particularly described and shown, it is to be understood that such description is used merely as an illustration and example rather than limitation, and the spirit and scope of the present invention is determined solely by the terms of the appended claims.

What is claimed is:

1. A resonator comprising:

a dielectric plate;

an earth electrode formed on one surface of said dielectric plate in a plane shape;

a pattern electrode formed in a spiral shape on the other surface of said dielectric plate opposite to said earth electrode and one end of said pattern electrode being connected to said earth electrode, said spiral shape including an inner loop which terminates at an inner end, at an end of said pattern electrode opposite to said one end; and a take-out electrode drawn out from said pattern electrode toward an end of said dielectric plate and spaced a distance away from said one end of said pattern electrode;

wherein a width of said pattern electrode becomes narrower continuously from said one end toward said inner end.

2. A resonator comprising:

a dielectric plate;

an earth electrode formed on one surface of said dielectric plate in a plane shape;

a pattern electrode formed in a spiral shape on the other surface of said dielectric plate opposite to said earth electrode and one end of said pattern electrode being connected to said earth electrode, said spiral shape including an inner loop which terminates at an inner end, at an end of said pattern electrode opposite to said one end; and a take-out electrode drawn out from said pattern electrode toward an end of said dielectric plate and spaced a distance away from said one end of said pattern electrode;

wherein an area ratio S2/S1 is 0.15 or more, S1 being an area of said pattern electrode and S2 being an area defined within said inner loop of said spiral pattern electrode where said pattern electrode is not formed.

3. A resonator in accordance with claim 2 wherein a width of said pattern electrode becomes narrower continuously from said one end toward said inner end.

4. A chip type filter comprising:

a dielectric plate;

an earth electrode formed on one surface of said dielectric plate in a plane shape;

plural pattern electrodes each formed in a spiral shape on the other surface of said dielectric plate opposite to said earth electrode and one end of each of said pattern electrodes being connected to said earth electrodes, said spiral shape including an inner loop which terminates at an inner end, at an end of said pattern electrode opposite to said one end; and take-out electrodes each drawn out from a respective one of said pattern electrodes toward an end of said dielectric plate and spaced a distance away from said one end of the respective one of said pattern electrodes;

wherein an area ratio S2/S1 of each of said pattern electrodes is 0.15 or more, S1 being an area of said pattern electrode and S2 being an area defined within said inner loop of each of said spiral pattern electrodes where said pattern electrode is not formed, and said pattern electrodes are coupled electromagnetically.

5. A chip type filter in accordance with claim 4 wherein each of said pattern electrodes becomes narrower continuously from said one end toward said inner end.

6. A chip type filter in accordance with claim 4 wherein a shield electrode is formed so as to be opposed to said pattern electrodes and said take-out electrodes at an inverse position of said earth electrode.

7. A chip type filter in accordance with claim 6 wherein said shield electrode is connected to said earth electrode electrically.

8. A chip type filter in accordance with claim 6 wherein said shield electrode is in an insulation state from other electrodes.

9. A chip type filter in accordance with claim 5 wherein a shield electrode is formed so as to be opposed to said pattern electrodes and said take-out electrodes at an inverse position of said earth electrode.

10. A chip type filter in accordance with claim 9 wherein said shield electrode is connected to said earth electrode electrically.

11. A chip type filter in accordance with claim 9 wherein said shield electrode is in an insulation state from other electrodes.

12. A chip type filter comprising:

a dielectric plate;

an earth electrode formed on one surface of said dielectric plate in a plane shape;

plural pattern electrodes each formed in a spiral shape on the other surface of said dielectric plate opposite to said earth electrode and one end of each of said pattern electrodes being connected to said earth electrode, said spiral shape including an inner loop which terminates at an inner end, at an end of said pattern electrode opposite to said one end; and take-out electrodes each drawn out from a respective one of said pattern electrodes toward an end of said dielectric plate and spaced a distance away from said one end of the respective one of said pattern electrodes;

wherein a width of each of said pattern electrodes becomes narrower continuously from said one end toward said inner end.

13. A chip type filter in accordance with claim 12 wherein a shield electrode is formed so as to be opposed to said pattern electrodes and said take-out electrodes at an inverse position of said earth electrode.

14. A chip type filter in accordance with claim 13 wherein said shield electrode is connected to said earth electrode electrically.

15. A chip type filter in accordance with claim 13 wherein said shield electrode is in an insulation state from other electrodes.

* * * * *